(12) United States Patent
Yamamoto

(10) Patent No.: US 7,357,165 B2
(45) Date of Patent: Apr. 15, 2008

(54) METHOD AND APPARATUS FOR CUTTING PROTECTIVE TAPE

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 289 days.

(21) Appl. No.: 10/947,170

(22) Filed: Sep. 23, 2004

(65) Prior Publication Data

US 2005/0081988 A1    Apr. 21, 2005

(30) Foreign Application Priority Data

Oct. 17, 2003  (JP)  ............................. 2003-357381

(51) Int. Cl.
*B26D 5/02* (2006.01)
*B26D 1/26* (2006.01)
*B32B 38/04* (2006.01)

(52) U.S. Cl. ...................... 156/353; 156/267; 156/270; 156/522; 156/523; 156/552; 82/47; 82/48; 83/34

(58) Field of Classification Search ................ 156/270, 156/267, 353, 522, 523, 552; 29/25.01; 83/34, 83/56; 82/47, 48, 51; 219/68
See application file for complete search history.

(56) References Cited

U.S. PATENT DOCUMENTS 4,603,609 A * 8/1986 Takatoshi ....................... 82/51

FOREIGN PATENT DOCUMENTS

JP  2002-057208 A  2/2002
JP  2003-209082 A1  7/2003

OTHER PUBLICATIONS

Office Action for corresponding China Patent Application No. 200410085580, dated Aug. 3, 2007.

* cited by examiner

*Primary Examiner*—Mark A Osele
(74) *Attorney, Agent, or Firm*—Cheng Law Group PLLC

(57) ABSTRACT

The present invention provides a method of moving a cutter blade along a circumferential edge of a semiconductor wafer, thereby cutting a protective tape joined to a surface of the semiconductor wafer with a pattern formed thereon for protecting the pattern before the semiconductor is processed. The cutter blade moves in the state where a side face thereof is brought into contact with the circumferential edge of the semiconductor wafer, thereby cutting the protective tape joined to the surface of the semiconductor wafer.

6 Claims, 10 Drawing Sheets

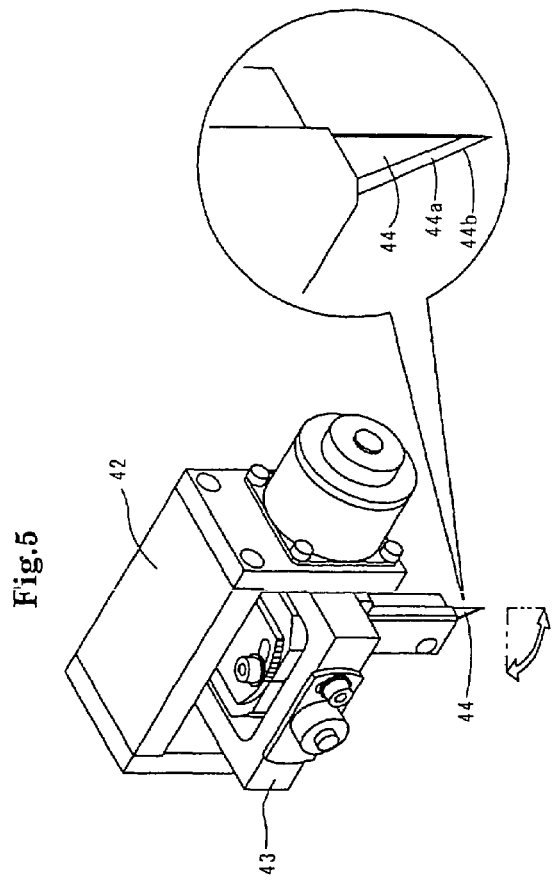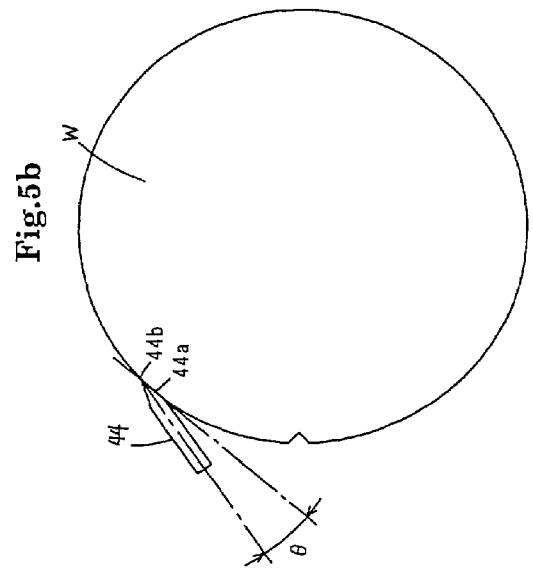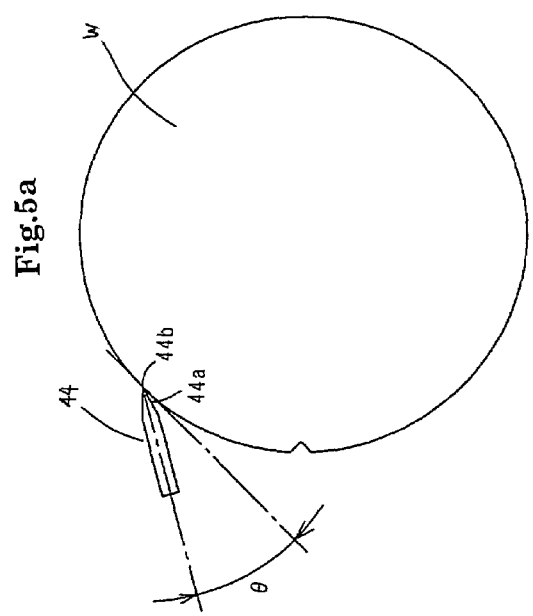

METHOD AND APPARATUS FOR CUTTING PROTECTIVE TAPE

BACKGROUND OF THE INVENTION (1) Field of the Invention

The present invention relates to a technique for cutting, along a circumferential edge of a semiconductor wafer, a protective tape joined to a surface of the semiconductor wafer with a pattern formed thereon for protecting the pattern.

(2) Description of the Related Art

In a conventional producing procedure of a semiconductor wafer, a back surface of a semiconductor wafer (hereinafter, simply referred to as "wafer") is worked using a mechanical method such as a grinding method and a polishing method (CMP) or a chemical method such as an etching method, thereby reducing a thickness of the wafer. When the wafer is worked using such a method, a protective tape is joined to a surface for protecting a pattern formed on the surface.

That is, a surface (patterned surface) of a wafer transported to a back grind step is suction-held by a chuck table, and its back surface is ground by a grindstone. Herein, since stress caused by the grinding operation is applied to the surface of the wafer and there is a probability that the pattern is damaged or contaminated. Therefore, the protective tape is joined to the surface. After the protective tape is joined to the wafer, the protective tape is usually cut in the state where a tip end of a cutter blade is brought into contact with an outer circumference of the wafer (see JP-A 2003-209082 for example).

If the protective tape is cut in the state where the tip end of the cutter blade is brought into contact with the outer circumferential edge of the wafer, the tip end of the cutter blade is prone to be damaged by friction with respect to the wafer. In this state, if the protective tape joined to the surface of the wafer is cut, there is a problem that viscoelastic particle component of the protective tape protrudes from the cut portion and the particles are attached to the outer circumferential edge of the wafer. If the particles are attached to the protective tape, only this portion is ground and thinned by a subsequent back grinding operation, and variation of a thickness of a wafer is increased.

SUMMARY OF THE INVENTION

The present invention is made in view of the above circumstances, and it is an object of the present invention to provide a method and an apparatus capable of cutting a protective tape joined to a surface of a wafer while reducing particles on the protective tape.

In order to achieve the above object, the present invention employs the following configuration:

A method for cutting a protective tape joined to a surface of a semiconductor wafer with a pattern formed thereon by moving a cutter blade along a circumferential edge of the semiconductor wafer, the method comprising the step of:

moving the cutter blade in the state where a side face thereof is brought into contact with the circumferential edge of the semiconductor wafer, thereby cutting the protective tape joined to the surface of the semiconductor wafer.

According to the method of the present invention, the protective tape is cut in the state where the side face of the cutter blade is brought into contact with the circumferential edge of the wafer. Therefore, it is possible to prevent a tip end of the cutter blade from being damaged. For this reason, the sharpness of the cutter blade is not changed; thus, it is possible to prevent particles of viscoelastic component from being generated from a cut portion of the protective tape. With this configuration, grinding variation can be suppressed at the time of back grinding.

In the method according to the present invention, the cutter blade moves in the state where a tip end thereof is not brought into contact with the circumferential edge of the semiconductor wafer.

According to the method of the present invention, since the cutter blade moves in the state where a tip end thereof is not brought into contact with the circumferential edge of the semiconductor wafer, the tip end of the cutter blade is can be prevented from being damaged. Thus, it is unnecessary to exchange the cutter blade for a long term, and the back grinding can be stably carried out.

In the method according to the present invention, preferably, the semiconductor wafer includes an orientation flat, and the cutter blade follows the circumferential edge of the semiconductor wafer having a curvature of the semiconductor wafer and a circumferential edge of the orientation flat such that a side face thereof is brought into contact with these circumferential edges.

According to the method of the present invention, the side face of the cutter blade can always follow such that the side face is brought into contact with the circumferential edge of the semiconductor wafer in accordance with the shape of the semiconductor wafer.

In the method according to the present invention, preferably, the cutter blade vertically moves in accordance with a contact portion of the semiconductor wafer.

According to the method of the present invention, the height of the cutter blade can be changed in accordance with the contact portion of the semiconductor wafer. That is, the cutter blade can be maintained such that a predetermined portion of the cutter blade is brought into contact with the semiconductor wafer.

In order to achieve the above object, the present invention also employs the following configuration:

An apparatus for cutting a protective tape joined to a surface of a semiconductor wafer with a pattern formed thereon, the apparatus comprising:

holding means for mounting and holding the semiconductor wafer thereon;

tape supply means for supplying the protective tape toward the held semiconductor wafer;

joining means for joining the supplied protective tape to the surface of the semiconductor wafer;

a cutter unit for cutting out the protective tape joined to the surface of the semiconductor wafer along a circumferential edge of the semiconductor wafer;

separating means for separating an unnecessary portion of the protective tape which has been cut out; and a collector for collecting the separated unnecessary tape, wherein the cutter unit includes a cutting direction adjusting mechanism capable of adjusting a direction of a cutter blade such that a side face of the cutter blade, which cuts the protective tape along the circumferential edge of the semiconductor wafer, is brought into contact with the circumferential edge of the semiconductor wafer.

According to the apparatus of the present invention, upon cutting of the protective tape, it is possible to adjust such that a tip end of the cutter blade is not brought into contact with the circumferential edge of the wafer in accordance with the size of the wafer. Therefore, the shape of the tip end of the cutter blade is not damaged by the friction with respect to the wafer, and it is unnecessary to exchange the cutter blade for a long term. Upon cutting of the protective tape, it is possible to prevent particles of the viscoelastic body from being generated from the cut portion of the protective tape; therefore, the grinding variation caused by back grinding can be reduced.

Preferably, the apparatus according to the present invention further comprises: a sensor for detecting a position of the cutter blade; and a controller for controlling the cutting direction adjusting mechanism which adjusts the direction of the cutter blade such that the side face of the cutter blade is brought into contact with the circumferential edge of the semiconductor wafer on the basis of a result of detection by the sensor.

With this configuration, the side face of the cutter blade can always follow such that the side face is brought into contact with the circumferential edge of the semiconductor wafer in accordance with the shape of the semiconductor wafer.

Preferably, the apparatus according to the present invention further comprises a motor for vertically moving the cutting direction adjusting mechanism, and the controller adjusts the motor, which vertically moves the cutting direction adjusting mechanism, in accordance with a position of the cutter blade where the cutter blade is brought into contact with the semiconductor wafer.

With this configuration, the height of the cutter blade can be changed in accordance with the contact portion of the semiconductor wafer. That is, the cutter blade can be maintained such that a predetermined portion of the cutter blade is brought into contact with the semiconductor wafer.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 5, consisting of FIGS. 5, 5(a), and 5(b), illustrates a contact angle of a cutter blade with respect to a wafer;

DESCRIPTION OF THE PREFERRED EMBODIMENTS

Hereinafter, description will be given of one example of embodiment of the present invention with reference to the drawings.

Figure 1:
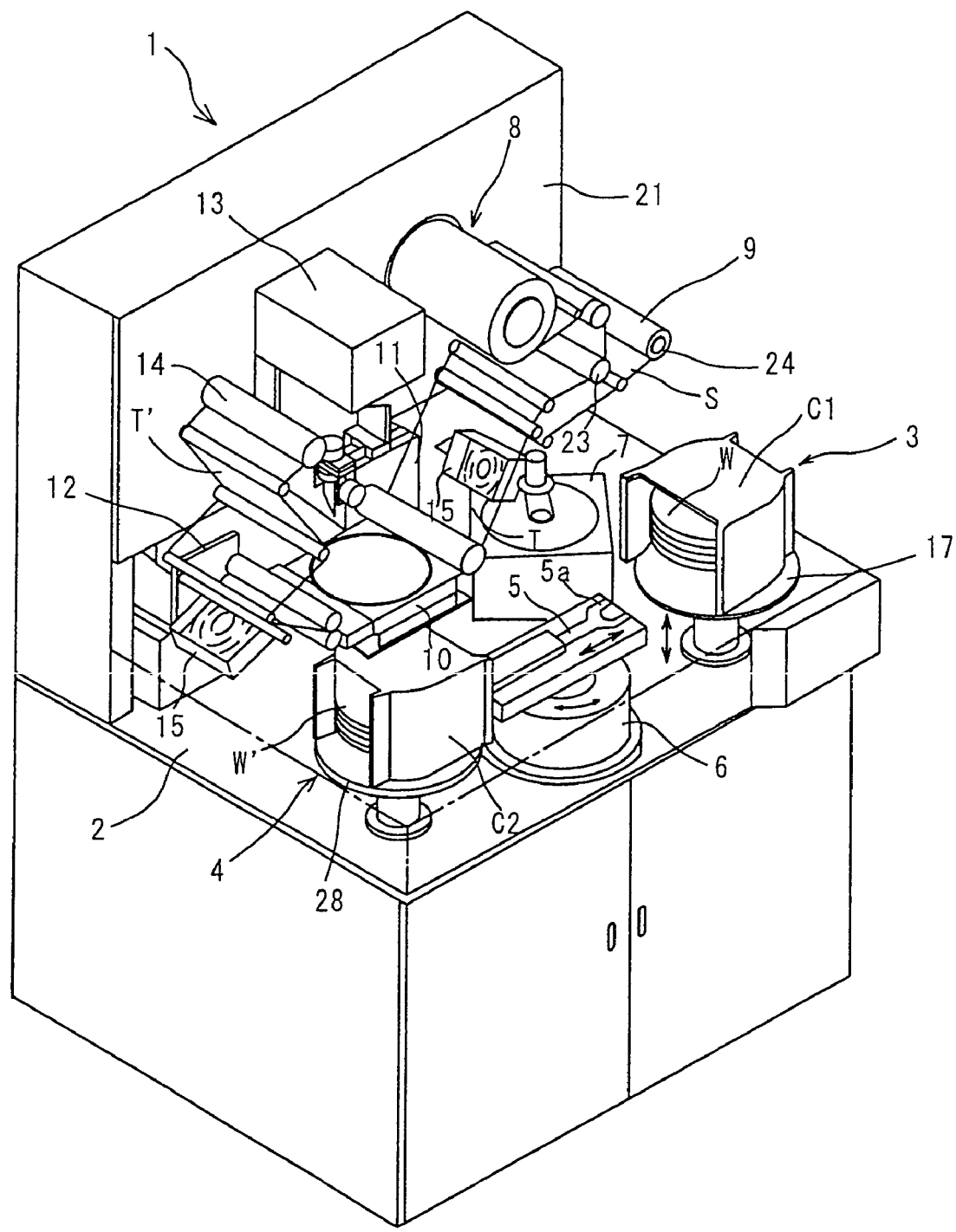
FIG. 1 is a perspective view showing the entire configuration of a protective tape joining apparatus.

FIG. 1 is a perspective view showing a schematic configuration of a protective tape joining apparatus with which a protective tape cutting apparatus according to this embodiment is equipped.

This protective tape joining apparatus 1 includes a base 2. On the base 2, on the side of its front edge, there are provided a wafer supply unit 3 into which a cassette C1 is loaded, and a wafer collector 4 which collects a processed wafer W'. Semiconductor wafers W (hereinafter, simply referred to as "wafers W") having orientation flats are contained in the cassette C1. A protective tape T is joined to a surface of the wafer W, and the protective tape T is cut. This wafer is called the processed wafer W'. A wafer transport mechanism 6 having a robot arm 5 is disposed between the wafer supply unit 3 and the wafer collector 4. An alignment stage 7 is disposed on a right far side of the base 2. A tape supply unit 8 for supplying the protective tape T toward the wafer W is disposed above the alignment stage 7. A separator collector 9 is disposed diagonally rightward below the tape supply unit 8. The separator collector 9 collects only a separator S from the protective tape T having the separator supplied from the tape supply unit. On the left side of the alignment stage 7, there are provided a chuck table 10, a tape joining unit 11, and a tape separating unit 12. The wafer W is mounted on the chuck table 10. The chuck table 10 suction-holds the wafer W. The tape joining unit 11 joins the protective tape T to the wafer W held by the chuck table 10. The tape separating unit 12 separates an unnecessary tape T' after the protective tape is joined to the wafer W and is cut out. A tape cutting mechanism 13 is disposed above the tape separating unit 12 for cutting out the protective tape T joined to the wafer W along an outer shape of the wafer W. A tape collector 14 is disposed above the base 2 on the left side thereof. The tape collector 14 winds up and collects the unnecessary tape T' which has been separated by the tape separating unit 12. A protective tape T before it is joined to the wafer W and a static electricity eliminating apparatus 15 which eliminates the static electricity from the unnecessary tape T' before it is collected are disposed on opposite sides of the chuck table 10.

Hereinafter, specific description will be given of each mechanism.

The wafer supply unit 3 includes a cassette stage 17 which can vertically move. The cassette C1, which contains therein the wafers W at multi-stages in a horizontal posture such that the patterned surfaces of the wafers W face upward, is mounted on the cassette stage 17.

The robot arm 5 provided on the wafer transport mechanism 6 can horizontally move forward and backward, and the entire robot arm 5 can turn. A horse shoe-shaped wafer holder 5a of a vacuum-suction type is provided at a tip end of the robot arm 5. The wafer holder 5a is inserted into a space between the wafers W contained in the cassette C1 at multi-stages and suction-holds the wafer W from its back surface. The suction-held wafer W is pulled out from the cassette C1 and, then, is sequentially transported to a later-described alignment stage 7, the chuck table 10 and the wafer collector 4 in this order.

The alignment stage 7 positions the wafer W, which has been transported and mounted by the wafer transport mechanism 6, on the basis of the orientation flat formed on an outer circumference of the wafer transport mechanism 6.

Figure 6:
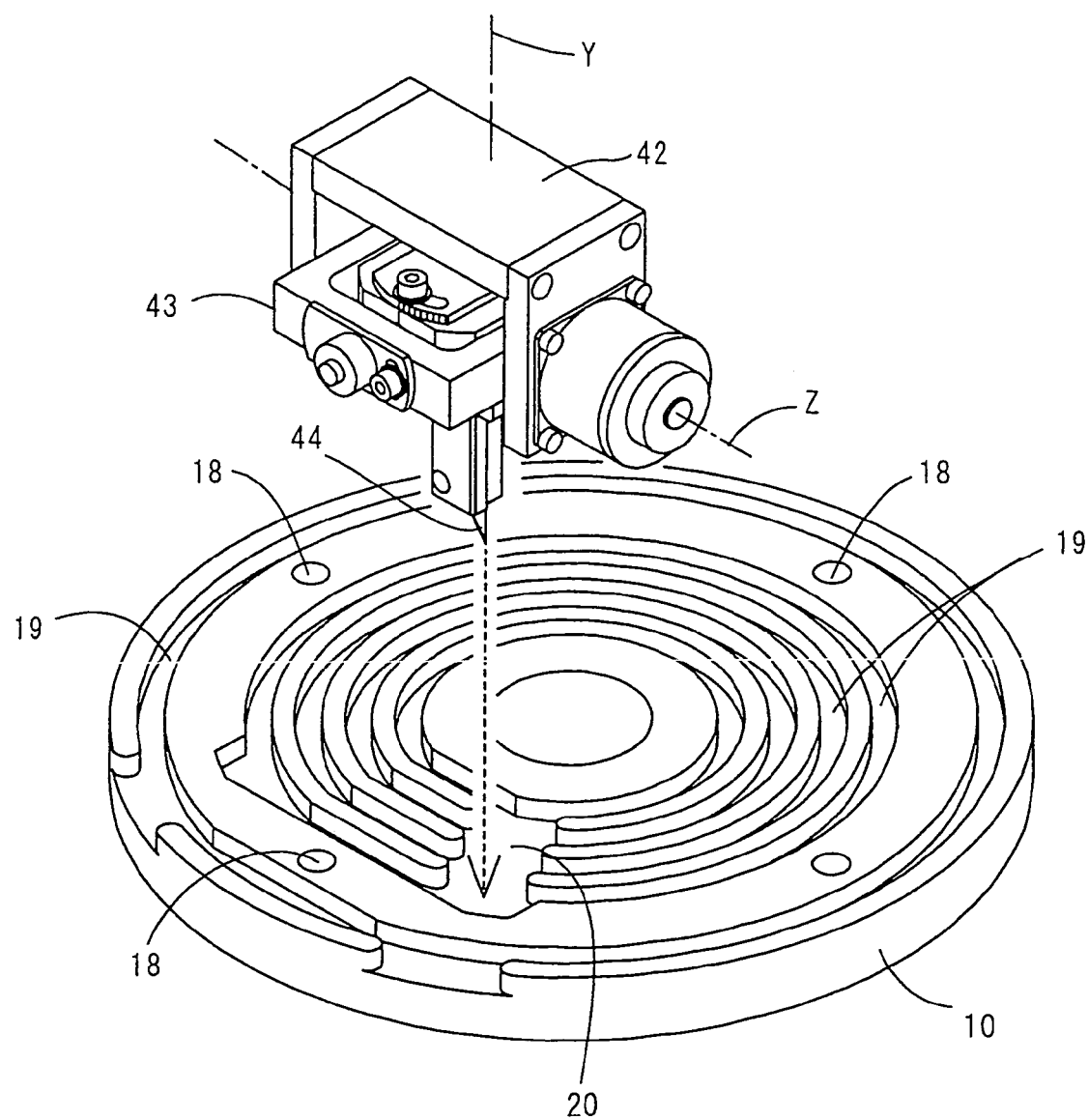
FIG. 6 is a perspective view showing a main part of the tape cutting mechanism and a chuck table.

The chuck table 10 mounts thereon the wafer W transported from the wafer transport mechanism 6 in a predetermined positioning posture. As shown in FIG. 6, the chuck table 10 covers the entire back surface of the wafer W and vacuum-sucks the wafer W through a sucking hole 18. The chuck table 10 is formed with a plurality of cutter running grooves 19 for turning a cutter blade 44 of the later-described tape cutting mechanism 13 along the outer shape of the wafer W and for cutting the protective tape. The plurality of cutter running grooves 19 are provided in accordance with wafers W having different sizes. An initial position of the cutter running grooves 19 where the cutter blade is first inserted forms a wide radial groove 20, and the cutter running grooves 19 are communicated with the radial groove 20.

Referring back to FIG. 1, the tape supply unit 8 winds around and guides into guide rollers 23 the protective tape T having the separator which has been unreeled from a tape bobbin 22 pivotally supported by a vertical wall 21 of the apparatus body. The tape supply unit 8 guides the protective tape T from which the separator S is separated into the tape joining unit 11. Appropriate rotation resistance is given to the tape bobbin 22 so that the tape is not unreeled excessively. A width of the protective tape T is wider than a diameter of the wafer W.

A collecting bobbin 24 winds up the separator S which has been separated from the protective tape T. The collecting bobbin 24 is pivotally supported by the vertical wall 21 of the apparatus body. The separator collector 9 is rotated in a winding-up direction by a driving mechanism (not shown) of a back portion of the vertical wall.

Figure 7:
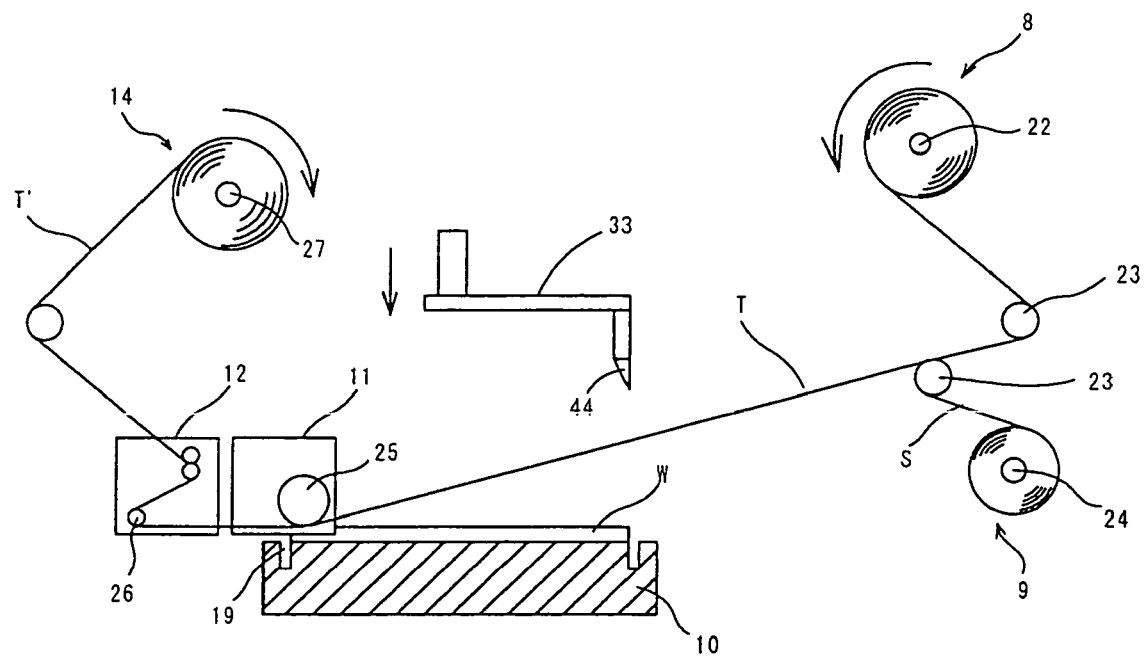
FIG. 7 is a schematic front view of a protective tape joining step.

The tape joining unit 11 has a frame which is grasped by rails of the apparatus body such that the frame can slide in a tape running direction, and the tape joining unit 11 is interlockingly connected to a driving unit such as a motor (not shown). As shown in FIG. 7, a joining roller 25 is rotatably supported by the frame. The joining roller 25 vertically swings by a cylinder (not shown) or the like. That is, the joining roller 25 presses the surface of the protective tape T and rolls and, in this state, the protective tape T is joined to the surface of the wafer W.

The tape separating unit 12 has a frame which is grasped by rails of the apparatus body such that the frame can slide in the tape running direction, and the tape separating unit 12 is interlockingly connected to a driving unit such as a motor (not shown). As shown in FIG. 7, a separating roller 26 is rotatably supported by the frame, and the separating roller 26 vertically swings by a cylinder (not shown) or the like. The separating roller 26 separates from the wafer W an unnecessary protective tape T' which has been cut out along the outer shape of the wafer W.

The tape collector 14 has a collecting bobbin 27 for winding up the unnecessary tape T'. The collecting bobbin 27 is pivotally supported by the vertical wall 21 of the apparatus body, and is rotated in the winding direction by a driving mechanism (not shown) mounted on a back portion of the vertical wall.

Referring back to FIG. 1, the wafer collector 4 includes a cassette stage 28 which can vertically move. A cassette C2, which contains therein the processed wafers W' to which the protective tapes T are joined and from which unnecessary portions of the protective tapes T are cut out and removed at multi-stages in a horizontal posture, is mounted on the cassette stage 28.

Figure 2:
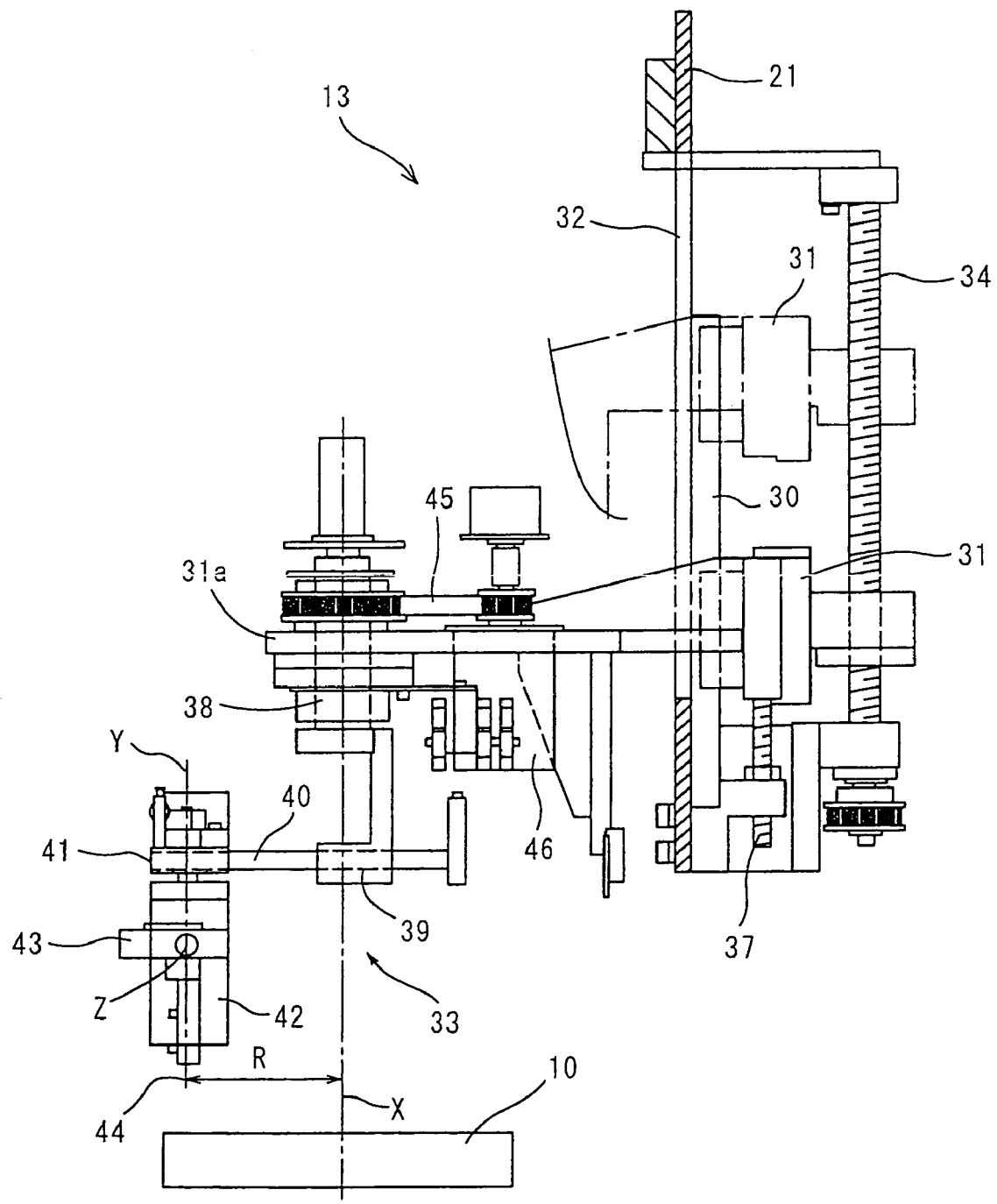
FIG. 2 is a side view of a tape cutting mechanism.

As shown in FIG. 2, the tape cutting mechanism 13 has a movable stage 31 which is supported by a back surface of the vertical wall 21 of the apparatus body. The movable stage 31 can vertically slide along a pair of left and right vertical rails 30. The movable stage 31 is continuously provided with a support arm 31a. The support arm 31a extends, in a cantilever manner, forward of the apparatus body through an opening 32 of the vertical wall 21. The support arm 31a is provided with a cutter unit 33.

Figure 3:
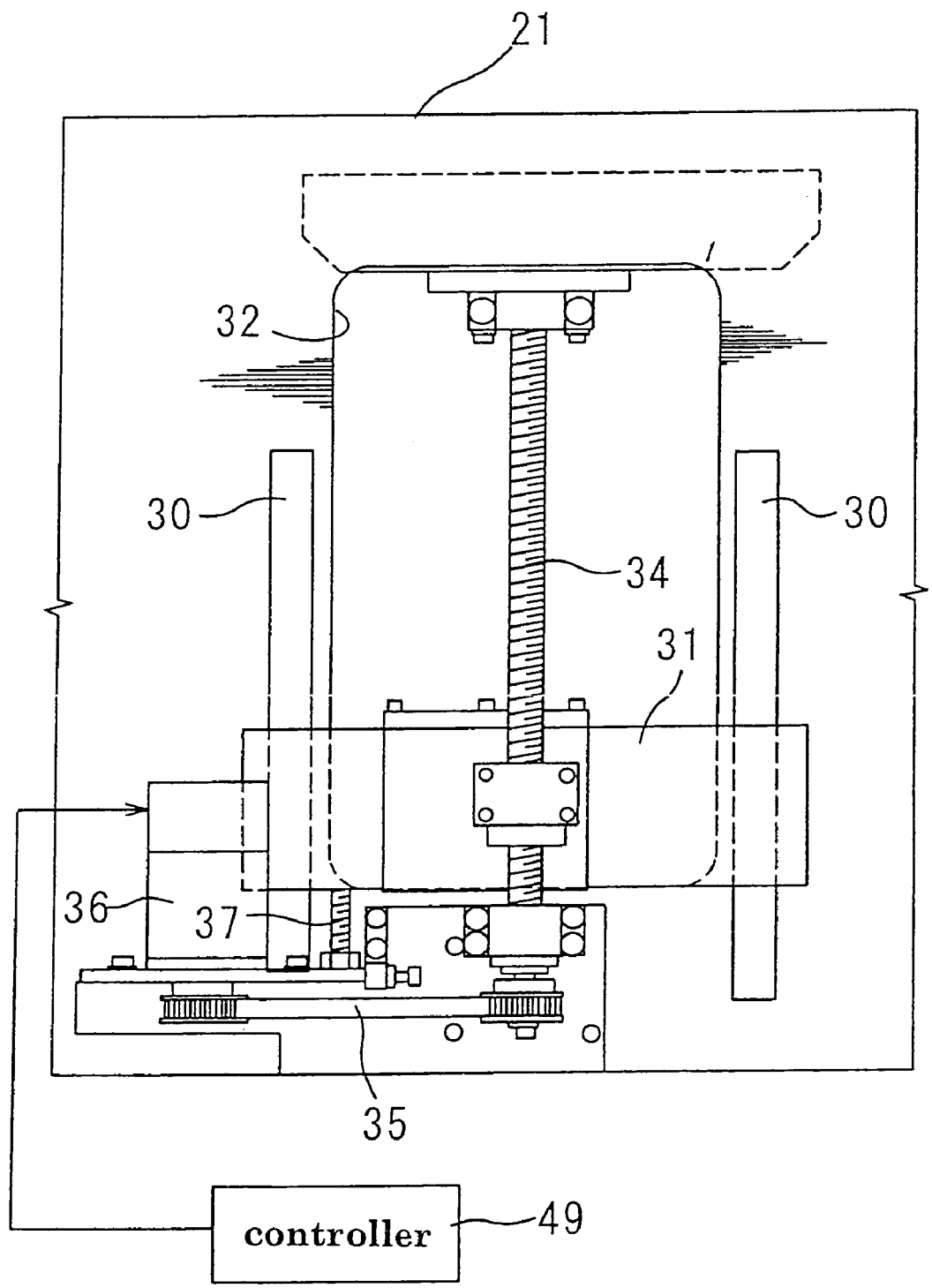
FIG. 3 is a rear view of the tape cutting mechanism.

The movable stage 31 is moved vertically by normally or reversely rotating a screw shaft 34. As shown in FIG. 3, the screw shaft 34 is interlockingly connected to a motor 36 through a belt-type power transmission mechanism 35. The belt-type power transmission mechanism 35 uses a timing belt or the like, and generates no slip. The movable stage 31 abuts against an adjustable stopper bolt 37 so that the descent limit of the movable stage 31 is defined.

Referring back to FIG. 2, a tip end portion of the support arm 31a is provided with a cutting drive shaft 38. The cutting drive shaft 38 is located on a center of the chuck table 10. The cutting drive shaft 38 can rotate around a vertical axis X. A boss 39 is connected to a lower end of the cutting drive shaft 38. A pair of expandable arms 40 are supported by the boss 39 such that the expandable arms 40 can slide horizontally. A support member 41 is connected to tip ends of the expandable arms 40. A gate-shaped turn bracket 42 is supported by the support member 41 such that the turn bracket 42 can rotate around a vertical axis Y.

A cutter holder 43 is supported by the turn bracket 42 such that the cutter holder 43 can swing around a horizontal fulcrum Z. The cutter blade 44 is detachably attached to a lower portion of the cutter holder 43. A cutting edge of the cutter blade 44 is directed downward.

The cutting drive shaft 38 is interlockingly connected to a motor 46 through a belt-type power transmission mechanism 45 which uses a timing belt or the like and generates no slip. That is, if the cutting drive shaft 38 is rotated, the cutter blade 44 is turned around the vertical axis X at radius R, and the cutter blade 44 cuts out the protective tape T joined to the wafer W.

Figure 4:
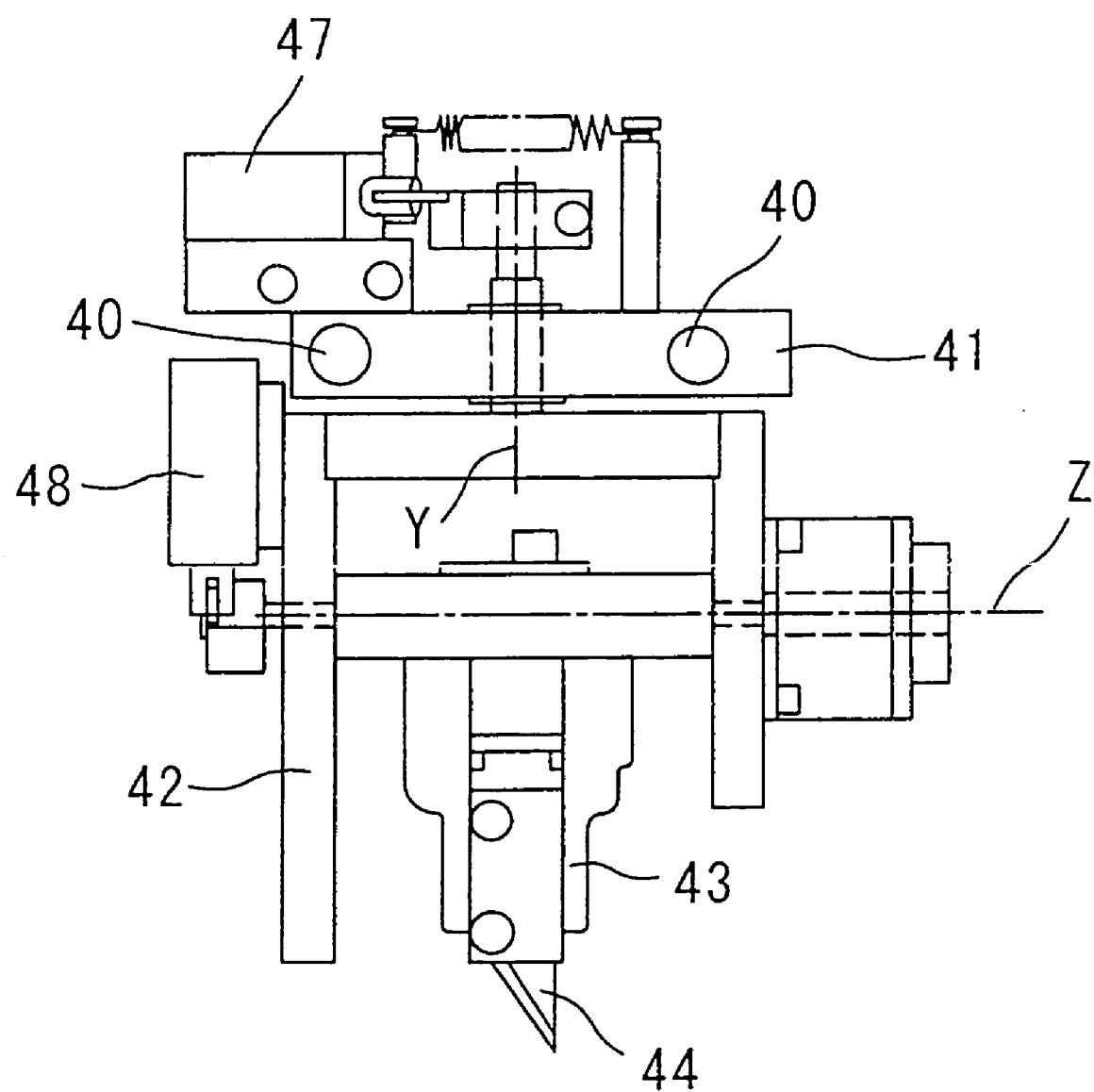
FIG. 4 is a front view showing a main part of a cutter unit.

The turn bracket 42 can rotate around the vertical axis Y by an air cylinder 47 shown in FIG. 4. By adjusting a rotation phase of the turn bracket 42, a direction of the cutting edge of the cutter blade 44, i.e., a direction of the tip end of the cutter blade 44 is adjusted. This turn bracket 42 functions as a cutting direction adjusting mechanism.

The cutter holder 43 can swing around the fulcrum Z by the air cylinder 48 shown in FIG. 4. If the cutter holder 43 and the cutter blade 44 swings around the upper fulcrum Z together, the cutter blade 44 moves toward and away from the vertical axis X.

A controller 49 controls the rotation of the motor 36 for adjusting a contact position (height) of the cutter blade 44 with respect to the protective tape T, thereby controlling the vertical movement of the tape cutting mechanism 13. Details thereof will be described in the following description of operation.

Next, description will be give of a series of operations for joining the protective tape T to the surface of the wafer W using the apparatus according to this embodiment.

If the cassette C1 containing therein the wafers W at multi-levels is mounted on the cassette stage 17 of the wafer supply unit, the cassette stage 17 moves vertically, and the cassette stage 17 stops at a height position where desired one of the wafers W can be taken out by the robot arm 5.

Next, the wafer transport mechanism 6 turns, the wafer holder 5a of the robot arm 5 is inserted into a space between the wafers in the cassette C1, the wafer holder 5a of the robot arm 5 suction-holds the wafer W from its back surface (lower surface) and takes it out, and transports the wafer W onto the alignment stage 7.

The wafer W mounted on the alignment stage 7 is positioned using the orientation flat, the positioned wafer W is again suction-held by the robot arm 5 and transported out, and moved onto the chuck table 10.

The wafer W mounted on the chuck table 10 is positioned such that its center is located on a center of the chuck table 10, and suction-held. Herein, as shown in FIG. 7, the tape joining unit 11 and the tape separating unit 12 stand by in the left initial positions, and the cutter unit 33 of the tape cutting mechanism 13 stands by in the upper initial position.

Figure 8:
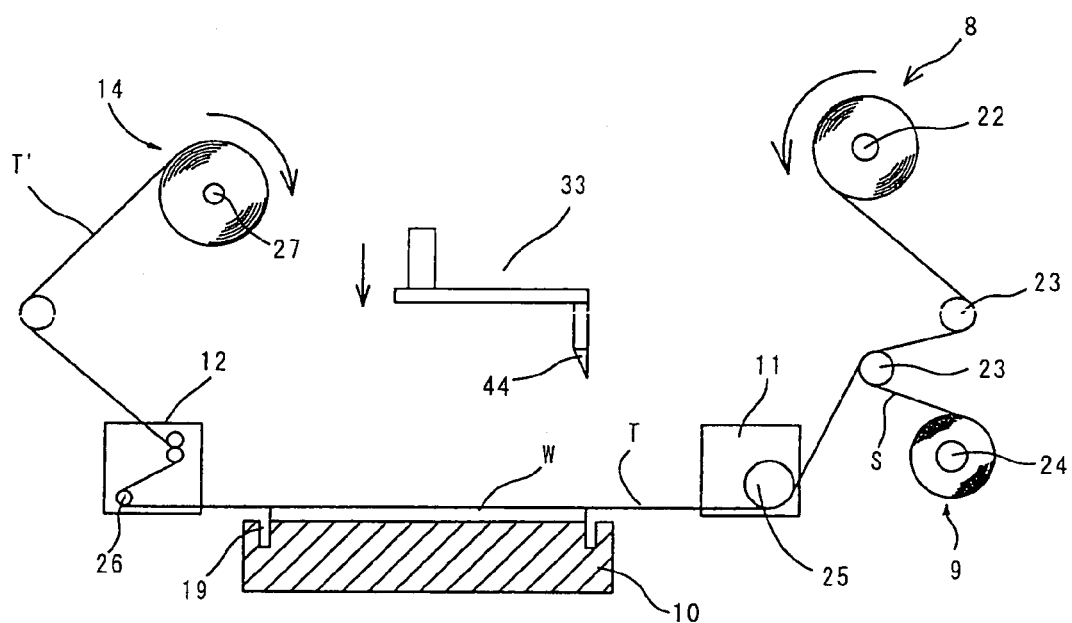
FIG. 8 is a schematic front view of the protective tape joining step.

If the positioning of the wafer W is completed, the joining roller 25 of the tape joining unit 11 is moved downward, the joining roller 25 presses the protective tape T downward as shown in FIG. 8 and, in this state, the joining roller 25 rolls on the wafer W in the direction opposite from the tape running direction (from left to right in FIG. 8). With this configuration, the protective tape T is uniformly joined to the entire surface of the wafer W. Then, if the tape joining unit 11 reaches the end position, the joining roller 25 is moved upward.

Figure 9:
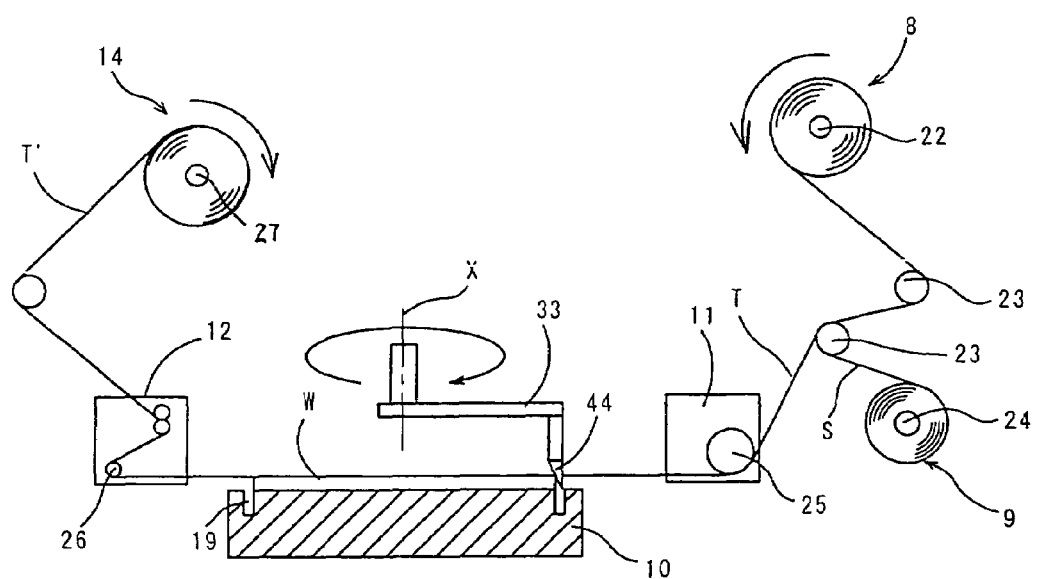
FIG. 9 is a schematic front view of a protective tape cutting step.

Next, the motor 36 is actuated, the tape cutting mechanism 13 is moved downward. As shown in FIG. 9, the cutter unit 33 which stood at the upper position is lowered to the cutting position, the cutter blade 44 sticks into and penetrates the protective tape T at a location corresponding to the radial groove 20 of the chuck table 10, and if the cutter blade 44 is lowered to a predetermined height position, the cutter blade 44 stops. In this case, the expandable arms 40 are previously slid and adjusted such that a turning radius R (see FIG. 2) of the cutter blade 44 with respect to the vertical axis X corresponds to a size of a wafer W to be processed.

Herein, as shown in FIG. 5-(b), the cutter blade 44 rotates such that any inclination angle θ is obtained between the cutter blade 44 and a tangent of the cut portion of the protective tape T of the wafer W, and control is exercised such that a side face 44a of the cutter blade 44 is brought into contact with a circumferential edge of the wafer W. In the conventional technique, the protective tape is cut such that a tip end 44b of the cutter blade 44 is brought into contact as shown in FIG. 5-(a), but if the side face 44a of the cutter blade 44 is brought into contact with the circumferential edge of the wafer W as shown in FIG. 5-(b), it is possible to prevent the tip end 44b of the cutter blade 44 from being damaged by friction or the like. As shown in FIG. 5, the kind of the cutter blade 44 is not limited as long as the cutter blade 44 can cut the protective tape. Thus, a double-edged cutter, a one side-edged cutter, a round-type cutter and the like can be employed.

Referring to FIG. 9, if the cutter blade 44 is stopped at a predetermined height, the motor 46 is actuated, the cutting drive shaft 38 is rotated in a predetermined direction and, with this, the cutter blade 44 turns around the vertical axis X, and the protective tape T is cut along the outer shape of the wafer. Herein, a predetermined tension is applied to the protective tape T by the tape joining unit 11 and the tape separating unit 12.

In this tape cutting step, the following control is exercised. That is, in the tape cutting procedure in the orientation flat region of the wafer W, the cutter blade 44 swings around the fulcrum Z together with the cutter holder 43 and, with this, the cutter blade 44 follows the orientation flat. In a first half from the starting end to the intermediate portion of the orientation flat, as the cutter blade 44 turns, the cutter blade 44 gradually swings toward the center of the wafer W. In a last half from the intermediate portion to the end of the orientation flat, as the cutter blade 44 turns, the cutter blade 44 swings in a direction separating away from the center of the wafer W to the original turning radius R. As the cutter blade 44 swings around the fulcrum Z, the cutter unit 33 is moved vertically by the motor 36.

Figure 10:
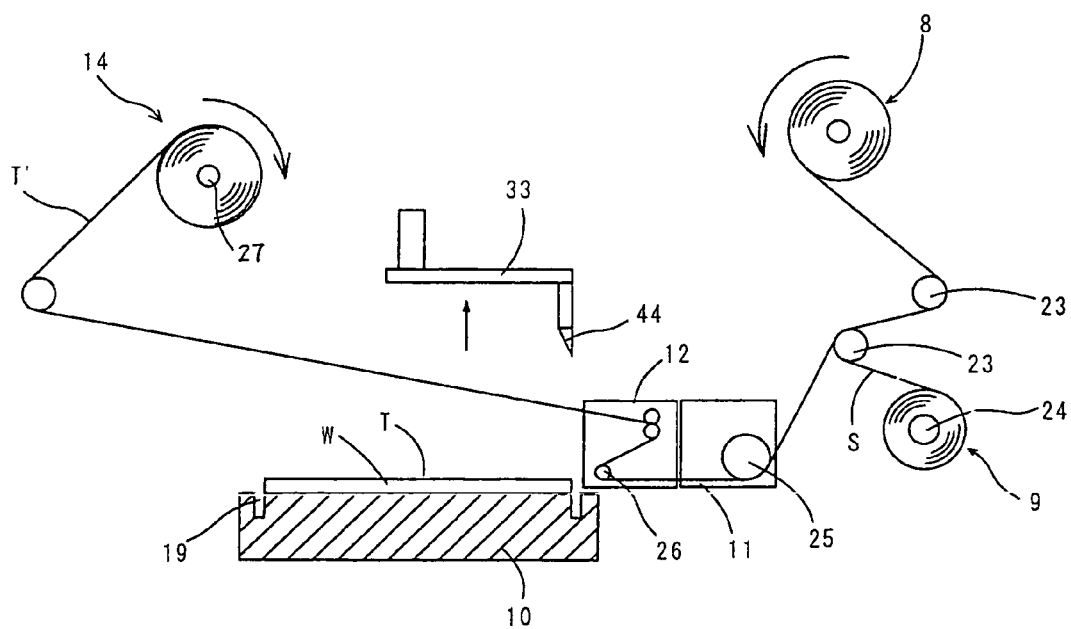
FIG. 10 is a schematic front view of a protective tape separating step.

A controller 47 controls the operation of the motor 36 which vertically moves the cutter unit 33. Data including sizes of the wafer W and the orientation flat, a height from the surface of the wafer W to the fulcrum Z and the like is previously input to the controller 47. A target height position of the cutter unit 33 is stored in the controller 47 as map data corresponding to the turning position of the cutter blade 44 around the vertical axis X. Therefore, if the turning position of the cutter blade 44 is detected by a sensor such as a rotary encoder, the target height position of the cutter unit 33 is determined based on the detection data, and the rotation of the motor 36 is controlled based on the target height position. If the cutting operation of the tape along the outer circumferential edge of the wafer W is completed, the cutting drive shaft 38 is stopped, and the cutter unit 33 is moved upward to the original standby position as shown in FIG. 10. Next, the tape separating unit 12 moves on the wafer W in the direction opposite from the tape running direction, and an unnecessary tape T' which has been cut out and remained on the wafer W is wound up and separated.

If the tape separating unit 12 reaches the completion position of the separating operation, the tape separating unit 12 and the tape joining unit 11 move in the tape running direction and return to the initial positions. Herein, the unnecessary tape T' is wound around the collecting bobbin 27, and a given amount of protective tape T is unreeled from the tape supply unit 8.

The series of operations for joining the protective tape T to the surface of the wafer W is completed, and these operations are repeated. In this case, when the cutter blade 44 cuts, the tip end of the cutter blade 44 cuts the protective tape T without contact with the circumferential edge of the wafer W. Therefore, the tip end of the cutter blade 44 is not damaged by friction or the like with respect to the wafer W. Thus, it is unnecessary to exchange the cutter blade 44 automatically or manually whenever a predetermined number of wafers are processed, and a large number of protective tapes can be cut using one cutter blade 44. Since the tip end of the cutter blade 44 is not damaged over the long term, it is possible to suppress the generation of particles from the cut surface of the protective tape T.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for cutting a protective tape joined to a surface of a semiconductor wafer with a pattern formed thereon by moving a cutter blade along a circumferential edge of the semiconductor wafer, the cutter blade having a non-cutting side face and a cutting tip end integrally formed with the side face, the method comprising the step of:
   moving the cutter blade in the state where the side face thereof is brought into contact with the circumferential edge of the semiconductor wafer and the tip end is not in contact with the circumferential edge of the semiconductor wafer, thereby cutting the protective tape joined to the surface of the semiconductor wafer.

2. The method according to claim 1, wherein
   the semiconductor wafer includes an orientation flat, and the cutter blade follows the circumferential edge of the semiconductor wafer having a curvature of the semiconductor wafer and a circumferential edge of the orientation flat such that a side face thereof is brought into contact with these circumferential edges.

3. The method according to claim 2, wherein
   the cutter blade vertically moves in accordance with a contact portion of the semiconductor wafer.

4. An apparatus for cutting a protective tape joined to a surface of a semiconductor wafer with a pattern formed thereon, the apparatus comprising:

holding means for mounting and holding the semiconductor wafer thereon;

tape supply means for supplying the protective tape toward the held semiconductor wafer;

joining means for joining the supplied protective tape to the surface of the semiconductor wafer;

a cutter unit for cutting out the protective tape joined to the surface of the semiconductor wafer along a circumferential edge of the semiconductor wafer, the cutter unit including a cutter blade having a non-cutting side face and a cutting tip end integrally formed with the side face;

separating means for separating an unnecessary portion of the protective tape which has been cut out; and a collector for collecting the separated unnecessary tape, wherein the cutter unit includes a cutting direction adjusting mechanism capable of adjusting a direction of the cutter blade such that the side face of the cutter blade is brought into contact with the circumferential edge of the semiconductor wafer and the tip end thereof is not in contact with the circumferential edge of the semiconductor wafer, wherein the protective tape joined to the surface of the semiconductor wafer is cut by the tip end without the tip end being in contact with the circumferential edge of the semiconductor wafer.

5. The apparatus according to claim 4, further comprising:

a sensor for detecting a position of the cutter blade; and a controller for controlling the cutting direction adjusting mechanism which adjusts the direction of the cutter blade such that the side face of the cutter blade is brought into contact with the circumferential edge of the semiconductor wafer on the basis of a result of detection by the sensor.

6. The apparatus according to claim 5, further comprising:

a motor for vertically moving the cutting direction adjusting mechanism, wherein the controller adjusts the motor, which vertically moves the cutting direction adjusting mechanism, in accordance with a position of the cutter blade where the cutter blade is brought into contact with the semiconductor wafer.

* * * * *